(12) United States Patent
Raad et al.

(10) Patent No.: US 6,502,215 B2
(45) Date of Patent: Dec. 31, 2002

(54) SELF-TEST RAM USING EXTERNAL SYNCHRONOUS CLOCK

(75) Inventors: George B. Raad, Boise, ID (US); David L. Pinney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 09/837,116

(22) Filed: Apr. 17, 2001

(65) Prior Publication Data

US 2002/0040454 A1 Apr. 4, 2002

Related U.S. Application Data

(60) Continuation of application No. 09/347,933, filed on Jul. 6, 1999, now Pat. No. 6,243,840, which is a division of application No. 08/540,157, filed on Oct. 6, 1995, now Pat. No. 5,925,142.

(51) Int. Cl.$^7$ ............................................... G11C 29/00
(52) U.S. Cl. ........................ 714/719; 714/718; 714/745
(58) Field of Search ........................... 365/222; 714/718, 714/719, 720, 734, 736, 745

(56) References Cited

U.S. PATENT DOCUMENTS

| | | | |
|---|---|---|---|
| 4,194,432 A | 3/1980 | Conway et al. .............. 89/41 C |
| 4,369,511 A | 1/1983 | Kimura et al. ................. 371/21 |
| 4,553,225 A | 11/1985 | Ohe ........................... 365/201 |
| 4,958,345 A | 9/1990 | Fujisaki ..................... 371/21.3 |
| 5,072,137 A | 12/1991 | Slemmer ..................... 307/465 |
| 5,075,892 A | 12/1991 | Choy ........................... 382/61 |
| 5,301,155 A | 4/1994 | Wada et al. ................. 365/201 |
| 5,309,446 A | 5/1994 | Cline et al. ................ 371/21.1 |
| 5,430,680 A * | 7/1995 | Parris ......................... 365/222 |
| 5,457,400 A | 10/1995 | Ahmad et al. .............. 324/763 |
| 5,457,696 A | 10/1995 | Mori ......................... 371/21.3 |
| 5,483,175 A | 1/1996 | Ahmad et al. .............. 324/766 |
| 5,550,784 A | 8/1996 | Takai ......................... 365/233 |
| 5,568,437 A | 10/1996 | Jamal ......................... 365/201 |
| 5,661,729 A | 8/1997 | Miyazaki et al. .......... 371/21.2 |
| 5,692,165 A | 11/1997 | Jeddeloh et al. ............ 395/551 |

* cited by examiner

Primary Examiner—David Ton
(74) Attorney, Agent, or Firm—Dorsey & Whitney LLP

(57) ABSTRACT

A semiconductor memory device is disclosed that can be operated in a speed test mode. The memory device includes an array of memory cells capable of storing data, a control circuit receiving a signal from an external system clock and controlling data transfer operations between the memory device and an external data bus, and a test mode circuit receiving the external clock signal. When operated in speed test mode, the control circuit, provides a signal to the test mode circuit enabling its function. A predetermined data pattern is first written to one or more cells, and then subsequently accessed during a read cycle. The enabled test mode circuit compares the contents of an internal data bus to the predetermined data pattern at a time referenced to the system clock signal. In the case of a failed comparison, the test mode circuit produces a signal that places the external data bus in a high impedance state. The disclosed memory device is therefore capable of itself providing some of the test functions previously provided by external testing equipment, and speed testing equipment in particular.

18 Claims, 4 Drawing Sheets

SELF-TEST RAM USING EXTERNAL SYNCHRONOUS CLOCK

CROSS-REFERENCE TO RELATED APPLICATION

This application is a continuation of U.S. patent application Ser. No. 09/347,933, filed Jul. 6, 1999, U.S. Pat. No. 6,243,840, which is a divisional of U.S. patent application Ser. No. 08/540,157, filed Oct. 6, 1995, U.S. Pat. No. 5,925,142.

TECHNICAL FIELD

This invention relates generally to electronic devices, and more particularly to memory devices and methods of testing such devices.

BACKGROUND OF THE INVENTION

Computer designers desire fast and reliable memory devices that will allow them to design fast and reliable computers. Manufacturers of memory devices, such as random access semiconductor memories, must test a full range of functionality and timing characteristics of the memory devices in order to provide a reliable product to their customers. Because each memory cell or bit of the memory device must be tested, the time and equipment necessary for testing memory devices of ever increasing cell number and density represents a significant portion of the overall manufacturing cost of such devices. Any reduction in the time to test each unit will reduce manufacturing costs.

Manufacturers of memory devices increasingly automate the testing procedure in order to save on testing time and cost. Automated testing is most easily accomplished after the memory device has been packaged as a semiconductor chip, because the chip can be inserted into a test socket. Automated testing circuitry then applies predetermined voltages and signals to the chip, writes test data patterns to the memory, reads data, and analyzes the results to detect memory speed, timing, failures, etc. The more chips that can be tested simultaneously, the greater testing time savings per chip.

Still more time can be saved if testing is performed simultaneously with other end-step manufacturing processes. For example, many manufacturers use a "burn-in" process to screen out devices that are likely to fail at an unacceptably early time following manufacture. During the burn-in process, memory chips are subject to elevated temperatures and voltages which then accelerate failures in any inherently weaker chips. The ability to automatedly and simultaneously test multiple chips during the burn-in process, rather than afterwards, saves time and reduces manufacturing cost.

While much of cell-to-cell defect and functionality testing can be accomplished during the burn-in process, speed testing memory chips has not been performed during burn-in. This is because speed testing today's increasingly fast memory devices requires highly precise generation of timing signals and precise measurement of memory device response thereto. Currently available speed testers do not perform well in the extreme environment of the burn-in process. Also, current speed testing equipment tests very few memory chips at a time, because capacitive loading and signal delay effects must be minimized. Thus, current speed testing equipment and methods add disproportionately to the testing time and manufacturing cost per chip.

Unsuccessful attempts have been made to address the disproportionate time and cost of speed testing by fabricating circuitry, on the chip to be tested, capable of providing at least some of the test functions usually provided by external speed testing equipment. For example, a predetermined data pattern is first written to the memory device and then accessed during a read cycle. Comparator circuits fabricated on-chip compare the read data to the predetermined data pattern and indicate whether the data accessed matches the expected pattern. For purposes of speed testing, these comparator circuits must perform the comparison function at particular determined times to indicate whether the expected data has been successfully accessed at those particular times. On-chip delay circuits have been constructed to provide the precise clocking signals necessary to trigger the function of the comparator circuits.

Speed testing is performed to determine in which of a number of determined speed grades a particular memory device belongs. Because of manufacturing process tolerance and variations, one memory device of a particular design may be faster than another memory device of the very same design. Because the on-chip delay circuits are themselves subject to the same process variations as the rest of the circuitry on the chip, these delay circuits cannot reliably be used to measure the effects of those variations.

SUMMARY OF THE INVENTION

According to the present invention, a semiconductor memory device is provided that can be operated in a speed test mode. The memory device includes an array of memory cells capable of storing data. The memory device also includes a control circuit receiving a system clock signal and controlling data transfer operations between the array of memory cells and an external data bus. The memory device further includes a test circuit receiving the system clock signal and coupled to an internal data bus. When operated in the speed test mode, the control circuit provides a test enable signal to the test circuit. A predetermined data pattern is written to one or more cells and subsequently accessed during a read cycle. The enabled test circuit compares the contents of the internal data bus to the predetermined data pattern at a time referenced to the system clock signal. The test circuit then produces a signal that places the external data bus in one of two states corresponding to whether a passed or failed comparison has occurred.

In a preferred embodiment, the test circuit includes a data pattern circuit that stores the predetermined data pattern and provides this pattern to a data compare circuit. The data compare circuit receives the clock signal and the test enable signal, and compares the contents of the internal data bus to the predetermined data pattern at a time referenced to the clock signal. In the event of a failed comparison, the data compare circuit produces a signal that disables an output circuit coupling the internal data bus and the external data bus.

DETAILED DESCRIPTION OF THE PREFERRED EMBODIMENT

Figure 1:
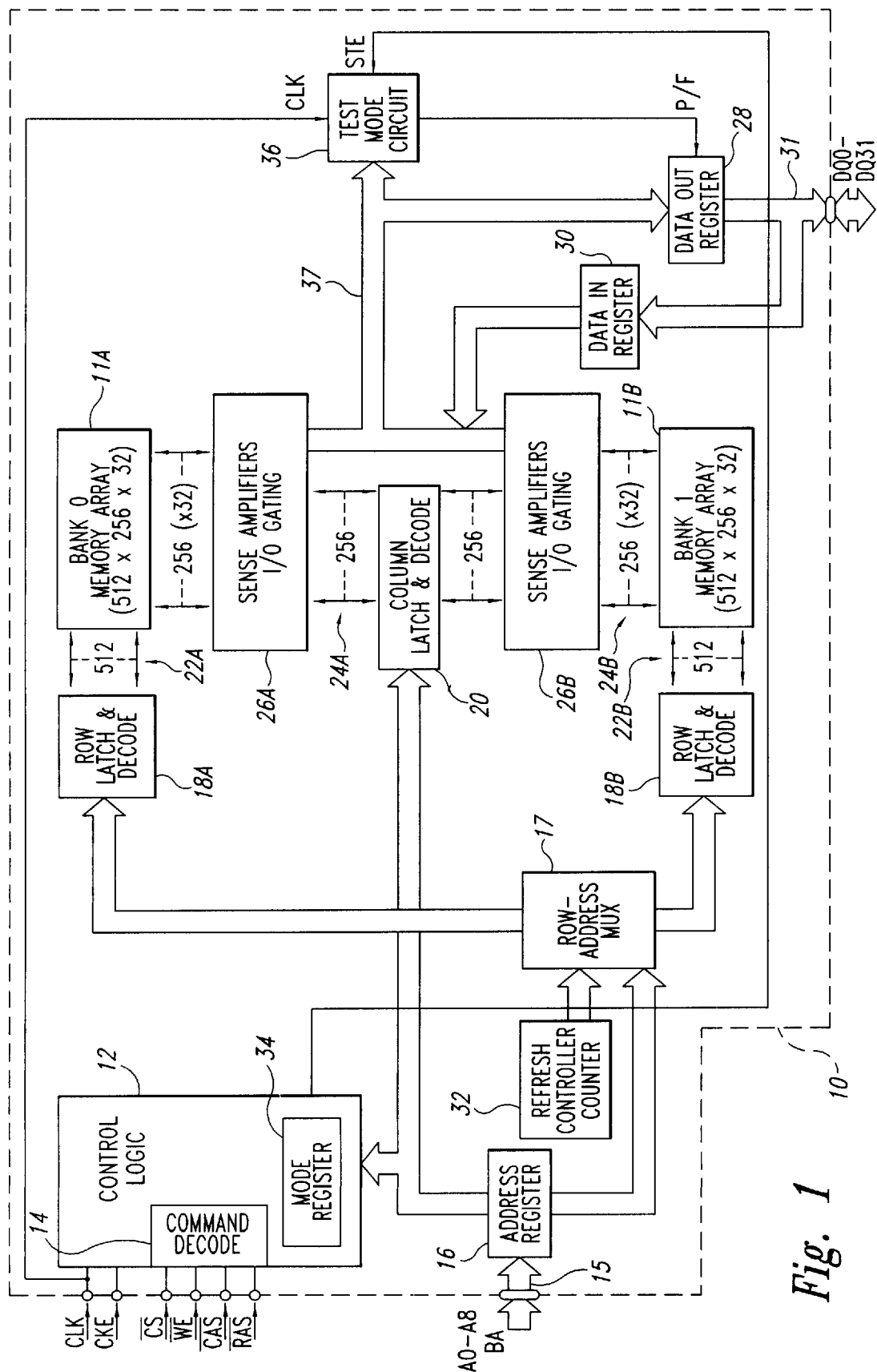
FIG. 1 is a block diagram showing a memory device having a Test Mode Circuit according to the present invention.

FIG. 1 shows a block diagram of the preferred embodiment of a memory device 10 according to the present invention. The memory device 10 is a synchronous dynamic random access memory (SDRAM) device that includes as its central memory element two memory array banks 11A and 11B. Each of the memory arrays 11A & B includes a plurality of memory cells (not shown) arranged in rows and columns. A control logic circuit 12 controls the data transfer steps associated with a read or write access to the memory cells in the arrays 11A & B. In one embodiment, each of the arrays 11A & B has memory cells arranged in 512 rows by 256 columns by 32 bits. The memory device 10 has a 32-bit word width—meaning that to a specified memory address (combined bank, row and column address) there is a one-to-one correspondence with 32 memory cells in one of the arrays 11A & B, and a processor (not shown) operates on data elements of 32 bits each.

A system clock (not shown) provides a CLK signal to the control circuit 12 of the memory device 10, as well as to the processor accessing the memory device. Command signals are provided to the control circuit 12 by the processor and decoded by command decode circuitry 14. These signals are well known in the art, and include signals such as CKE (clock enable), $\overline{CS}$ (chip select), $\overline{WE}$ (write enable), $\overline{RAS}$ (row address strobe) and $\overline{CAS}$ (column address strobe). Distinct combinations of the various command signals constitute distinct processor commands. For example, the combination of $\overline{CS}$ low, $\overline{WE}$ high, $\overline{RAS}$ low and $\overline{CAS}$ high can represent an ACTIVE command. Examples of other well known commands include READ, WRITE, NOP and PRECHARGE. Although the processor actually produces distinct command signals that in combination are registered and decoded as commands by the memory device 10, it is convenient to refer to these commands as being issued by the processor.

The control circuit 12 sends control signals on control lines (not shown) to other parts of the memory device 10, corresponding to the processor-issued command. These control signals control the timing of access to the memory cells in arrays 11A and 11B. The processor also provides to the memory device 10 an address of the memory location to be accessed on a 10-bit wide address bus 15, including a bank address specified by address bit BA and a row or column address specified by address bits A0–A8. The address is input to an address register 16 which provides the address information to the control circuit 12, a row-address mux 17, and a column-address latch and decode circuit 20.

In response to one or more control signals provided by the control circuit 12, the row-address mux 17 multiplexes row address information and provides it to one of two row-address latch and decode circuits 18A and 18B corresponding to the memory banks 11A & B to be accessed. In response to one or more control signals provided by the control circuit 12, each of the row latch and decode circuits 18A and 18B takes a row address provided by the row-address mux 17 and activates a selected row of memory cells (not shown) in the memory array 11A and 11B by selecting one of several row access lines 22A and 22B, respectively. In response to one or more control signals provided by the control circuit 12, the column latch and decode circuit 20 takes a column address provided by the address register 16 and selects one of several column access lines 24A and 24B, each of which is coupled to one of the memory arrays 11A and 11B by one of two I/O interface circuits 26A and 26B, respectively. In response to one or more control signals provided by the control circuit 12, each of the I/O interface circuits 26A & B selects the 32 memory cells corresponding to the column location in an activated row. The I/O interface circuits 26A & B include sense amplifiers which determine and amplify the logic state of the selected memory cells. The I/O interface circuits 26A & B also include I/O circuits that gate data to a data output register 28 and from a data input register 30, responsive to one or more control signals provided by the control circuit 12. The data registers 28 & 30 are connected to a 32-bit wide data bus 31 and transfer output data Q0–Q31 to the processor and input data D0–D31 from the processor, responsive to one or more control signals provided by the control circuit 12.

The memory device 10 includes a refresh control circuit 32 which, responsive to one or more control signals provided by the control circuit 12, initiates regular and periodic activation of each of the rows of the memory cells in the arrays 11A & B for purposes of data refresh, as is well known in the art. In response to one or more control signals provided by the control circuit 12, a respective one of the I/O interface circuits A & B senses data stored in the memory cells of the refresh-activated row and rewrites values corresponding to the stored data in each of the memory cells.

The control circuit 12 of the memory device 10 includes a mode register 34 used to register information regarding a chosen operating or test mode in which the memory device functions. The mode register 34 is accessed by registration of a LOAD MODE REGISTER command in the control circuit 12. In the described embodiment, this command corresponds to the combination of command signals $\overline{CS}$ low, $\overline{WE}$ low, $\overline{RAS}$ low and $\overline{CAS}$ low. Which of a variety of selected modes is chosen corresponds to the state of the 10-bit address bus 15 coincident with registration of the LOAD MODE REGISTER command. For example, an address 1110010000, corresponding with address bits A0–A8 and BA, registered in the address register 16 coincident with LOAD MODE REGISTER command registration in the control circuit 12 could place the memory device 10 into a first normal operating mode. In the first operating mode, full page access (all column addresses are accessed sequentially in an activated row) is provided with a read latency (the time between registration of a READ command and the availability of output data to the processor) of 2 system clock cycles. As another example, an address 0000010001 registered coincident with the LOAD MODE REGISTER command might place the memory device 10 into a first speed test mode. In the first speed test mode, simple access (memory cells corresponding to one column address are accessed in an activated row) is provided with a read latency of 2 system clock cycles.

The memory device 10 also includes a test mode circuit 36 coupled to an internal data output bus 37 connecting the I/O interface circuits 26A & B to the output register 28. The test mode circuit 36 is enabled by the control circuit 12 when the control circuit has received instructions, in the form of an "address" registered in the mode register 34, indicating that the memory device is to be operated in a test mode. In particular, when the control circuit 12 is instructed to operate the memory device 10 in the speed test mode, the control circuit provides a speed-test-enable signal STE that enables the test mode circuit 36 to perform speed testing of the memory device. The test mode circuit 36 also receives the system clock signal CLK, and provides a comparison or pass/fail signal P/F to the data output register 28. In the case of a failed comparison test (described below), the test mode circuit 36 provides a pass/fail signal P/F that disables, by conventional means, the data output register, causing a high impedance state on the data bus 31. In the case of a passed comparison test (described below), the state of the pass/fail signal P/F does not effect the data output register 28, and read-accessed data is provided on the data bus 31 as normally.

Figure 2:
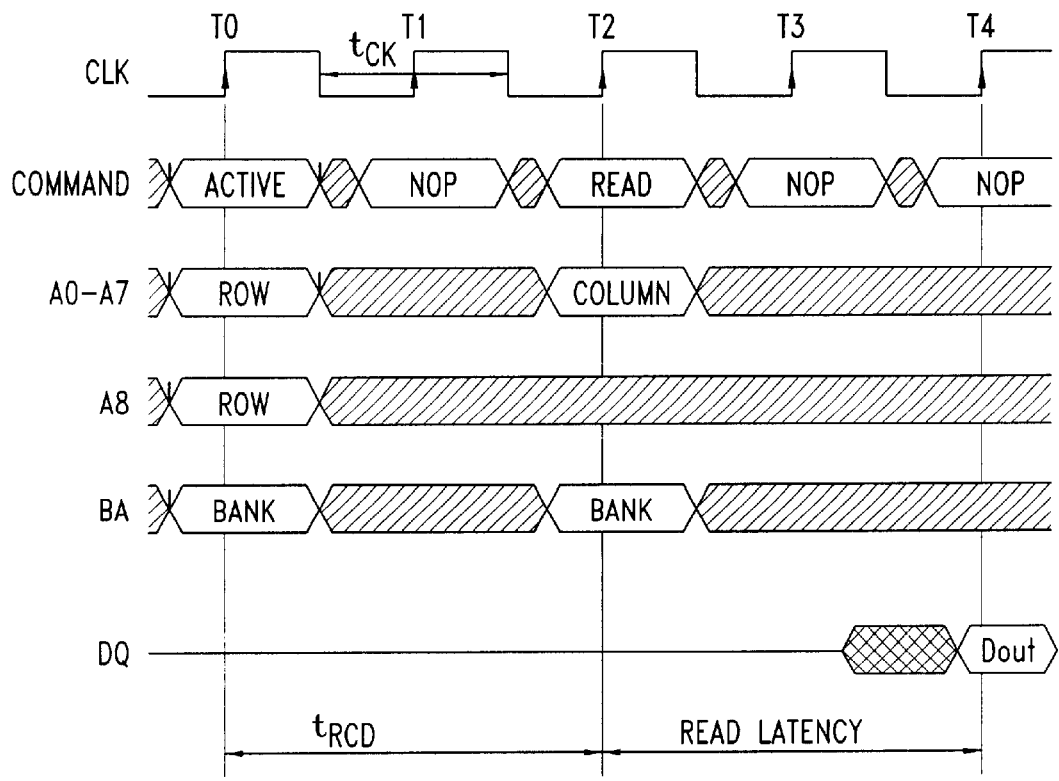
FIG. 2 is a timing diagram showing a read access during normal operation of the memory device of FIG. 1.

FIG. 2 shows a timing diagram depicting a read access, in which data stored in the memory device 10 is made available on the data bus 31 to the processor, during normal operating mode with a simple access and a read latency of 2 system clock cycles. FIG. 2 shows the system clock signal CLK with leading edges occurring at times T0–T4, with the time interval between successive leading edges being $t_{CK}$. ACTIVE, READ and NOP commands are registered in the memory device 10 at respective times corresponding to leading edges of the CLK signal. ROW, COLUMN and BANK addresses (1 bit, BA, is required to uniquely address one of 2 banks; 9 bits, A0–A8, are required to uniquely address one of 512 rows; and 8 bits, A0–A7, are needed to uniquely address one of 256 columns) are registered in the address register 16 at respective times corresponding to leading edges of the CLK signal. Also depicted is the state of the data bus 31, on which read-accessed data DOUT is output from the data output register 28 of the memory device 10 to the processor at a time corresponding to a leading edge of the CLK signal.

Referring to both FIGS. 1 and 2, an ACTIVE command is registered in the control circuit 12 coincident with a ROW and BANK address at time T0. The control circuit 12 initiates activation of a row corresponding to the registered address by sending the requisite control signals to the row address mux 17 and the corresponding one of the row-address latch and decode circuits 18A & B. After sufficient time to complete activation of the addressed row has elapsed ($t_{RCD}$), registration of a READ command and coincident registration of a COLUMN and the BANK address occurs at time T2. The control circuit 12 then initiates access to memory cells corresponding to the address by sending the requisite control signals to the column-address latch and decode circuit 20 and one of I/O interface circuits 26A & B corresponding to the bank address. After the preprogrammed read latency period of 2 clock cycles, data DOUT is made available by the data output register 28 on the data bus 31 at time T4.

Due to process variations during fabrication, all memory devices 10 do not function identically. In particular, certain memory devices 10 will allow faster data access than others. For example, a first speed grade of memory devices 10 will function correctly, as depicted in FIG. 2, at a system clock speed of 66 MHz ($t_{CK}$=15 ns), whereas others will not. Those memory devices 10 where the ratio $t_{RCD}/t_{CK}$ is less than two (i.e., $t_{RCD}$<30 ns), and where column access and signal development can be accomplished in less than two clock cycles, will function as depicted in FIG. 2. Those memory devices not functioning correctly will fail to provide data DOUT at time T4. Of those not in the first speed grade, a second speed grade of memory devices 10 will function correctly at a system clock speed of 50 MHz ($t_{CK}$=20 ns), and a third speed grade will function correctly at a system clock speed of 40 MHz ($t_{CK}$=25 ns), and so on.

Figure 3:
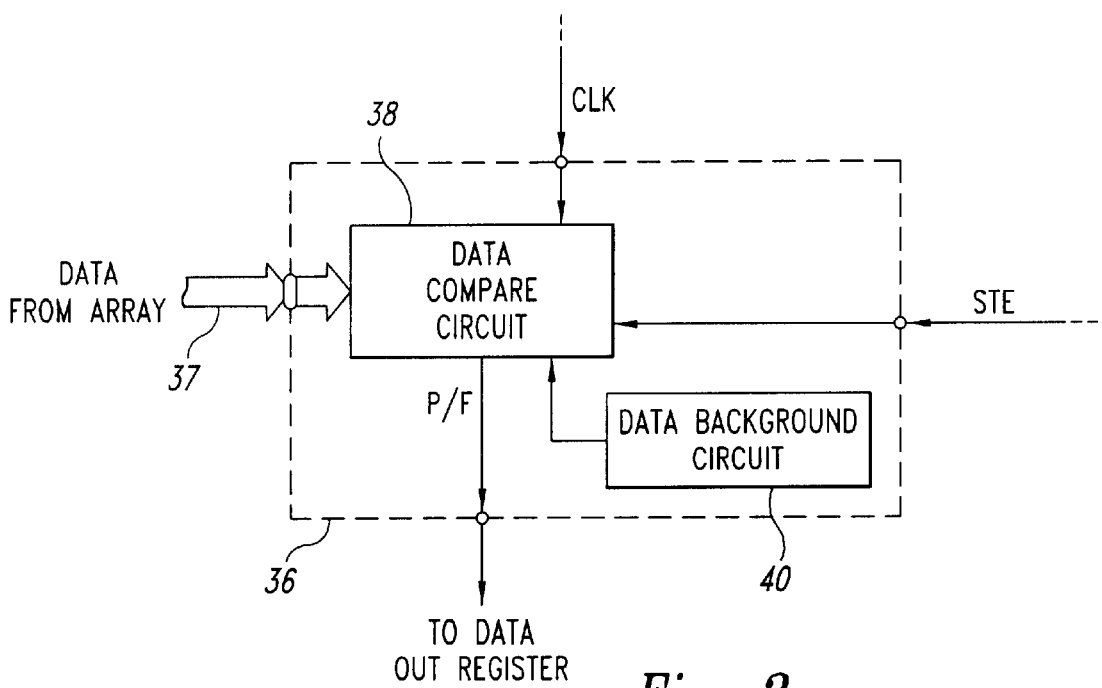
FIG. 3 is a block diagram showing details of the Test Mode Circuit of the memory device of FIG. 1.

When the control circuit 12 is programmed to operate the memory device 10 in the speed test mode, test mode circuit 36 is capable of determining the speed grade of the memory device 10. Referring to FIG. 3, the test mode circuit 36 includes a data compare circuit or comparator 38 and a data pattern or background circuit 40. The data background circuit 40 is a register or other similar device that stores a predetermined 32-bit data pattern. The internal timing and logic gate structure of the comparator 38 can be implemented by any of numerous designs well known to the art. The comparator 38 is coupled to the data background circuit 40 and to the internal data output bus 37. The comparator 38 receives the signal STE from the control circuit 12 (see FIG. 1) that enables the comparator to compare the data on the internal data output bus 37 to the data pattern provided by the data background circuit 40 at a time referenced to the system clock signal CLK.

A predetermined data pattern matching that contained in the data background circuit 40 is written to the memory device 10, and subsequently accessed during a read cycle. The comparator 38 compares the contents of the internal bus 37 to the data pattern of the data background circuit 40 at a time referenced to the clock signal CLK. If the read-accessed data is available on the internal bus 37 at the referenced time—a passed comparison—the comparator 38 will produce the signal P/F that allows the data output register 28 (see FIG. 1) to function as in a normal operating mode. The read-accessed data will then be made available on the external data bus 31. This, of course, assumes that no cell defect or other functional errors have occurred, and that access time is the only variable at issue. If the read-accessed data is not available on the internal data bus 37 at the referenced time—a failed comparison—comparator 38 will produce the signal P/F that disables the data output register 28. The external data bus 31 is then placed in a high impedance state. In one embodiment, all 32 bits of the external data bus 31 are placed in a high impedance state. In a second embodiment, only those bits of the external data bus 31 are placed in a high impedance state as correspond to the bits not presented on the internal data bus 37 to the comparator 38 at the requisite time.

Figure 4:
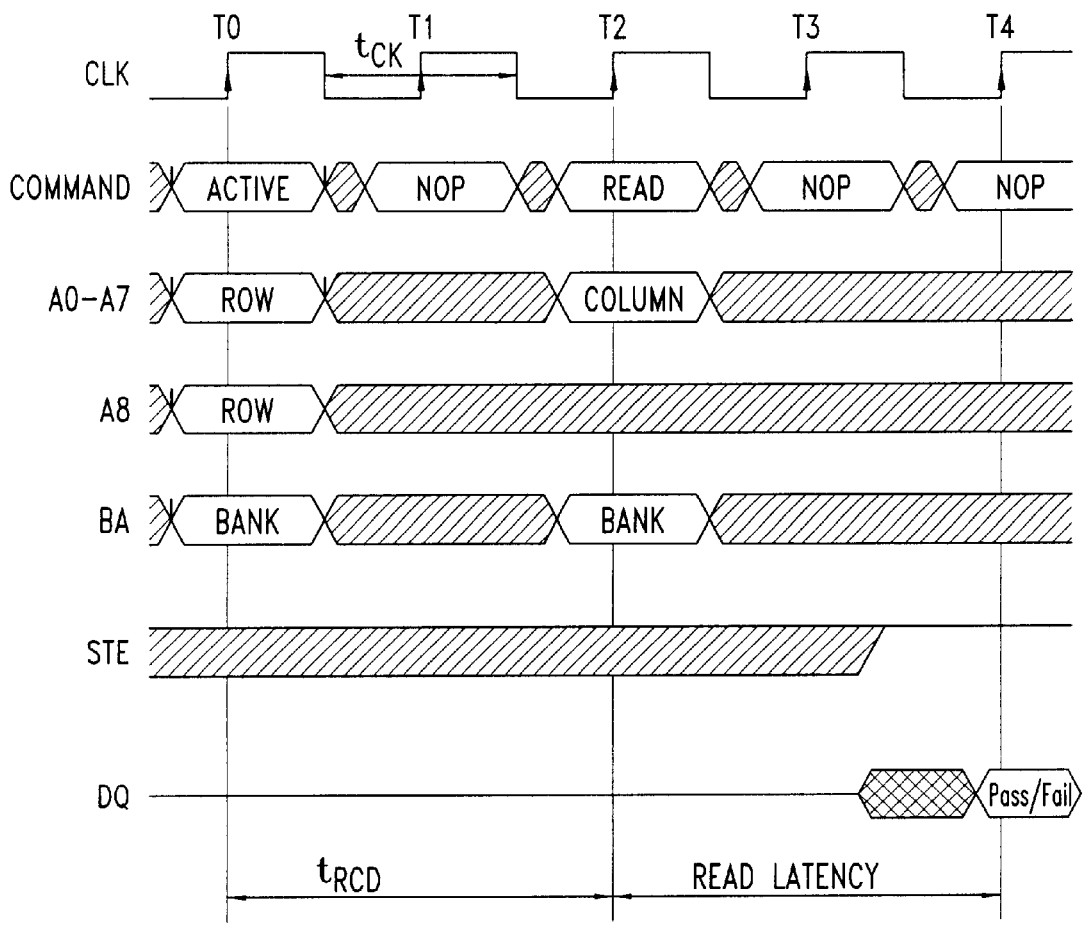
FIG. 4 is a timing diagram showing a read access during test mode operation of the memory device of FIG. 1.

FIG. 4 shows a timing diagram depicting a read access during operation of the memory device 10 in the speed test mode. Like the timing diagram of FIG. 2, FIG. 4 shows the system clock signal CLK with leading edges occurring at times T0–T4; ACTIVE, READ and NOP commands registered in the memory device 10 at respective times corresponding to leading edges of the CLK signal; and ROW, COLUMN and BANK addresses registered in the address register 16 at respective times corresponding to leading edges of the CLK signal. FIG. 4 also shows the state of the speed test enable signal STE, and the state of the external data bus 31 on which successfully read-accessed data is output from data output register 28, or which is placed in a high impedance state in the case of an unsuccessful access to the data stored in the memory device 10.

Referring to both FIGS. 1 and 4, an ACTIVE command is registered in the control circuit 12 coincident with a ROW and BANK address at time T0. The control circuit 12 initiates activation of a row corresponding to the registered address by sending the requisite control signals to the row address mux 17 and the corresponding one of the row-address latch and decode circuits 18A & B. After the $t_{RCD}$ test time of two clock cycles has elapsed, registration of a READ command and coincident registration of a COLUMN and the BANK address occurs at time T2. The control circuit 12 then initiates access to memory cells corresponding to the address by sending the requisite control signals to the column-address latch and decode circuit 20 and one of the I/O interface circuits 26A & B corresponding to the bank address. Prior to the lapse of the programmed read latency period of 2 clock cycles, the control circuit 12 provides to the test mode circuit 36 the speed test enable signal STE. At the leading edge of the CLK signal corresponding to time T4, the comparator 38 (see FIG. 3) compares the contents of the internal data bus 37 to the data pattern of the data background circuit 40 and produces the pass/fail signal P/F selectively disabling the data output register 28 in the case of data not timely available on the internal data bus.

Figure 5:
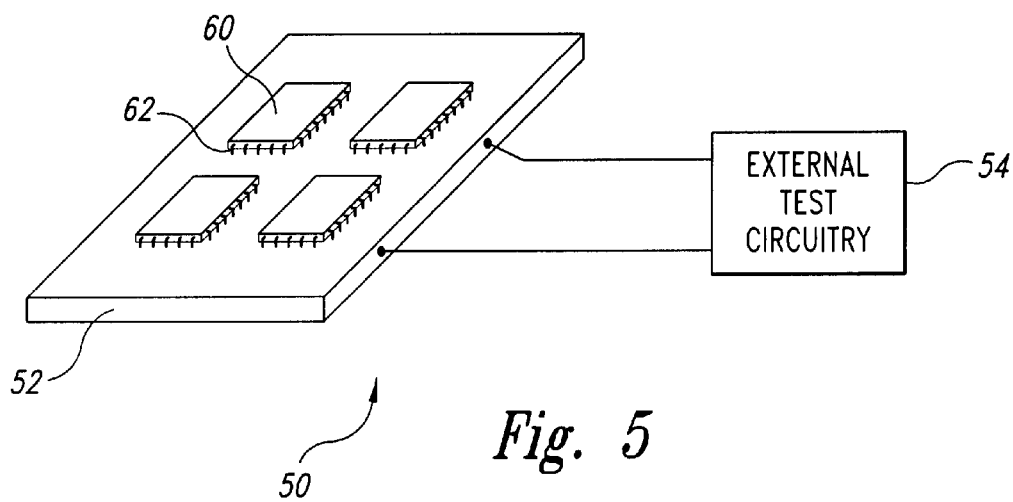
FIG. 5 is a part isometric view, part block diagram of a testing station for testing a chip package containing the memory device of FIG. 1.

FIG. 5 shows a testing station 50 for testing a plurality of packaged chips 60, each containing one or more of the memory devices 10 according to the present invention. The testing station includes a test board 52 releasably holding each of the chips 60 and providing electrical connections between chip leads 62 and external test circuitry 54. Each of the input and output terminals of the memory device 10, such as the clock and command signal inputs, address inputs A0–A8 & BA, and data bus in/outputs DQ0–DQ31, are electrically coupled to a respective one of the chip leads 62.

The test circuitry 54 includes microprocessor or microcontroller circuitry, a system clock, and memory for performing testing routines and storing the results thereof The above-described speed testing of memory devices 10 can be performed by the testing station 50 during the burn-in process, during which the chips 60 are subject to elevated temperatures and operating voltages. The speed testing can be performed at different clock speeds to identify and sort the memory devices 10 according to their respective speed grades. The on-chip test mode circuitry 36 (see FIG. 1) provides reliable timing of speed testing, even in the hostile environment of the burn-in process, due to the comparator being triggered by the system clock signal CLK.

Figure 6:
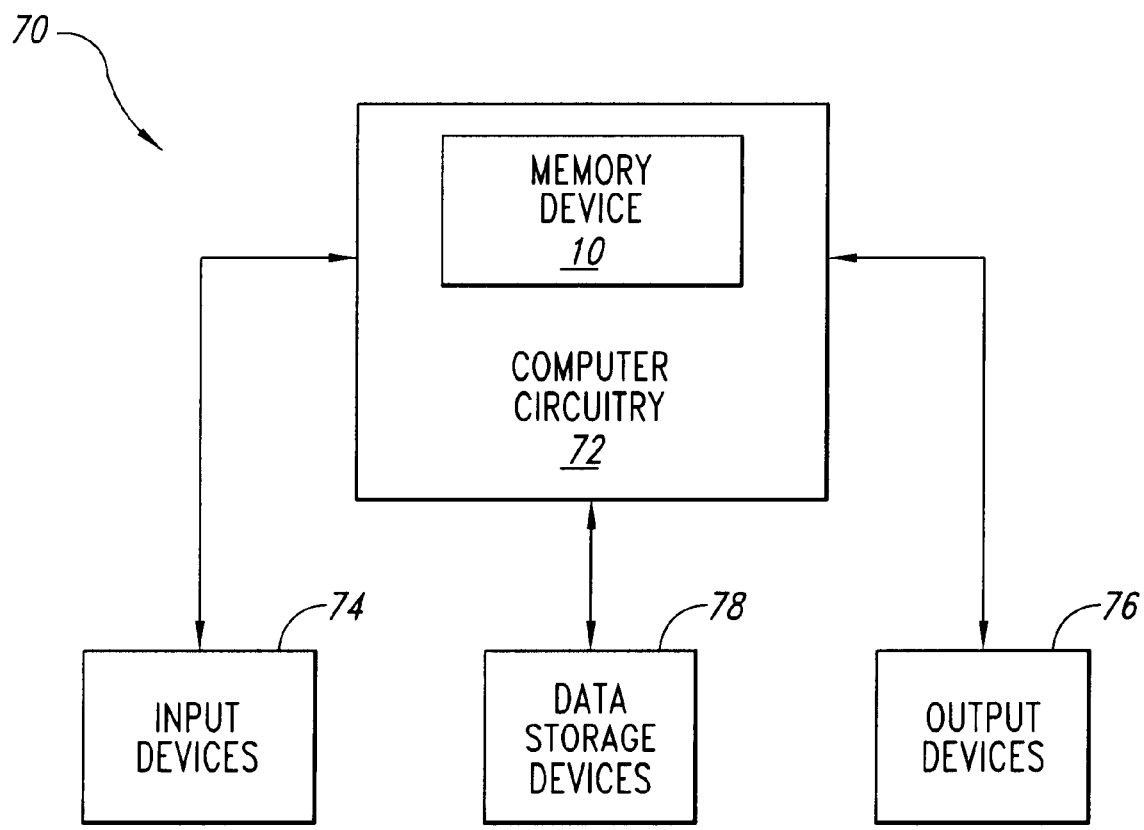
FIG. 6 is a block diagram of a computer system containing the memory device of FIG. 1.

FIG. 6 is a block diagram of a computer system 70 that uses a memory device 10 according to the present invention. The computer system 70 includes computer circuitry 72 for performing such computer functions as executing software to perform desired calculations and tasks. Circuitry 72 typically contains a processor (not shown) and the memory device 10 as shown. One or more input devices 74, such as a keyboard or a pointing device, is coupled to the computer circuitry 72 and allows an operator (not shown) to manually input data thereto. One or more output devices 76 is coupled to the computer circuitry 72 to provide to the operator data generated by the circuitry. Examples of output devices 76 include a printer and a video display unit. One or more data storage devices 78 is coupled to the computer circuitry 72 to store data on or retrieve data from external storage media (not shown). Examples of storage devices 78 and associated storage media include drives that accept hard and floppy disks, magnetic tape recorders, and compact-disc read only memory (CD-ROM) readers.

It will be appreciated that, although embodiments of the invention have been described above for purposes of illustration, various modifications may be made without deviating from the spirit and scope of the invention. For example, while the present invention has been described as applicable to measuring the access time characterized by parameter 'RCD, those skilled in the art will recognize that the present invention can be equally successfully applied to measure other access time parameters. As a further example, the present invention has been described as placing the external data bus in a high impedance state in the event of a failed test. Alternatively, a failed test could be indicated by a logic low signal and a passed test by a logic high signal. Accordingly, the invention is not limited except as by the appended claims.

What is claimed is:

1. A method for speed grade testing a memory device having a memory array, the method comprising:

applying a temperature or a voltage to the memory device that is elevated relative to a normal operating temperature or voltage, respectively, for a burn-in time period; and during the burn-in time period, coupling an externally generated clock signal to the memory device;

during the burn-in time period, coupling data from the memory array and internally comparing the data coupled from the memory array to predetermined data at a time referenced to the externally applied clock signal; and during the burn-in time period, determining a speed grade of the memory device by varying the timing of the clock signal and providing a signal indicative of the results of the comparison at each timing of the clock signal.

2. The method of claim 1 wherein the act of comparing the data coupled from the memory array to predetermined data at a time referenced to the externally applied clock signal comprises:

storing expect data in the memory device corresponding to data stored in the memory array and coupled from the memory array responsive to the clock signal;

comparing the data coupled from the memory array to the expect data; and providing an indication to an external terminal of the memory device indicative of the comparison between the data coupled from the memory array and the expect data.

3. The method of claim 2 wherein the act of providing an indication to an external terminal of the memory device indicative of the comparison between the data coupled from the memory array and the expect data comprises placing the external terminal of the memory device at a high impedance state.

4. The method of claim 2 wherein the act of providing an indication to an external terminal of the memory device indicative of the comparison between the data coupled from the memory array and the expect data comprises applying a predetermined signal to the external terminal of the memory device.

5. The method of claim 1 wherein the acts of coupling data from the memory array and internally comparing the data coupled from the memory array to predetermined data at a time referenced to the externally applied clock signal comprises:

at a first time referenced to the clock signal, registering a row activation command in the memory device;

at a second time referenced to the clock signal, registering a read data command in the memory device; and at a third time referenced to the clock signal comparing data read from the memory device to the predetermined data.

6. The method of claim 1 wherein the acts of providing a signal indicative of the results of the comparison at each timing of the clock signal comprises placing a set of externally accessible leads in a high impedance state responsive to the data coupled from the memory array negatively comparing to the expect data.

7. The method of claim 1 wherein the acts of providing a signal indicative of the results of the comparison at each timing of the clock signal comprises coupling the data coupled from the memory array to a set of externally accessible leads responsive to the data coupled from the memory array positively comparing to the expect data.

8. A method of speed grading a memory device, comprising:

applying a plurality of read commands to the memory device;

applying an externally generated, periodic clock signal to the memory device;

determining within the memory device if read data have been properly coupled from a predetermined location of the memory array at a time referenced to the clock signal; and determining the speed grade of the memory device by increasing the frequency of the clock signal and determining within the memory at each frequency if the read data have been properly coupled from the predetermined location of the memory array.

9. The method of claim 8, wherein the act of determining the speed grade of the memory device further comprises placing a set of externally accessible leads of the memory device in a high impedance if the read data have been improperly coupled from the predetermined location of the memory array.

10. The method of claim 8, wherein the act of determining the speed grade of the memory device further comprises coupling the read data to a set of externally accessible leads of the memory device if the read data have been properly coupled from the predetermined location of the memory array.

11. The method of claim 8 wherein the act of determining if read data have been properly coupled from the predetermined location of the memory array comprises:

storing expect data in the memory device corresponding to data stored in the predetermined location in the memory array of the memory device; and comparing the read data to the expect data.

12. The method of claim 11 wherein the act of comparing the read data to the expect data comprises comparing the read data to the expect data comprises at a time referenced to the externally generated, periodic clock signal.

13. The method of claim 12 wherein the act of comparing the read data to the expect data at a time referenced to the externally generated, periodic clock signal comprises:

coupling the read data and the expect data to a comparator; and enabling the comparator to compare the read data to the expect data responsive to the externally generated, periodic clock signal.

14. The method of claim 8 wherein the act of determining if read data have been properly coupled from the predetermined location of the memory array comprises comparing the read data to predetermined data at a time referenced to the externally generated, periodic clock signal.

15. The method of claim 8 wherein the act of determining if read data have been properly coupled from the predetermined location of the memory array further comprises:

placing a set of externally accessible leads of the memory device in a first state in the event read data have been properly coupled from the predetermined location of the memory array; and placing the set of externally accessible leads of the memory device in a second state in the event read data have been improperly coupled from the predetermined location of the memory array.

16. The method of claim 15, wherein the act of placing the set of externally accessible leads in a first state comprises coupling the read data to the set of externally accessible leads.

17. The method of claim 15, wherein the act of placing the set of externally accessible leads in a second state comprises placing the set of externally accessible leads in a high impedance state.

18. The method of claim 8 wherein the act of determining at each frequency if the read data have been properly coupled from the predetermined location of the memory array comprises determining at each frequency if the read data have been properly coupled from the predetermined location on a bit-by-bit basis.

* * * * *